United States Patent [19]

Farassat

[11] Patent Number: 4,878,609
[45] Date of Patent: Nov. 7, 1989

[54] APPARATUS FOR MANUAL WIRE BONDING

[75] Inventor: Farhad Farassat, Munich, Fed. Rep. of Germany

[73] Assignee: Emhart Industries Inc., Farmington, Conn.

[21] Appl. No.: 150,668

[22] PCT Filed: May 15, 1987

[86] PCT No.: PCT/EP87/00258

§ 371 Date: Feb. 18, 1988

§ 102(e) Date: Feb. 18, 1988

[87] PCT Pub. No.: WO87/06864

PCT Pub. Date: Nov. 19, 1987

[30] Foreign Application Priority Data

May 16, 1986 [DE] Fed. Rep. of Germany ....... 3616651

[51] Int. Cl.$^4$ .............................................. B23K 37/00
[52] U.S. Cl. ...................................... 228/4.5; 228/6.2; 228/101
[58] Field of Search .................... 228/4.5, 11, 12, 101, 228/102, 6.2

[56] References Cited

U.S. PATENT DOCUMENTS

| | | | |
|---|---|---|---|
| 3,596,050 | 7/1971 | Tikyian ................................. | 228/10 |
| 3,727,822 | 4/1973 | Umbaugh ............................... | 228/1 |
| 3,776,447 | 3/1973 | Adams et al. ......................... | 228/4.5 |
| 4,073,424 | 2/1978 | Kulicki, Jr. et al. ................ | 228/102 |
| 4,266,710 | 3/1981 | Bilane et al. ........................ | 228/4.5 |
| 4,437,603 | 3/1984 | Kobayashi et al. .................. | 228/4.5 |
| 4,555,052 | 11/1985 | Kurtz et al. ......................... | 228/4.5 |
| 4,571,688 | 2/1986 | Kashihara et al. .................. | 228/102 |
| 4,585,642 | 5/1986 | Dreibelbi ............................. | 228/4.5 |
| 4,597,522 | 7/1986 | Kobayashi ........................... | 228/4.5 |

FOREIGN PATENT DOCUMENTS 2047596 3/1980 United Kingdom .
83/04201 6/1984 World Int. Prop. O. .

*Primary Examiner*—Nicholas P. Godici
*Assistant Examiner*—Karen Skillman
*Attorney, Agent, or Firm*—Marshall, O'Toole, Gerstein, Murray & Bicknell

[57] ABSTRACT

An apparatus for manual wire bonding, comprising an ultrasonically energizable and/or thermocompression wedge (11) for pressing the wire (34) against a bonding pad, wherein the wedge (11) is part of a bonding head (10) adapted to be moved towards and away from said bonding pad, especially in up/down direction. The bonding pad is disposed on a base which is movable in a direction approximately transversely to the direction of movement of the bonding head (10) for positioning the bonding pad opposite said wedge (11). Furthermore, means is provided for controlling the drive unit (20) of the bonding head. Preferably, the drive unit (20) for the bonding head motion is a d.c. servomotor, wherein each part-motion and non-motion of the bonding head (10) can be adjusted individually in respect of travelling distance and speed and motionless period, respectively, and can be checked as to execution. To this end the drive unit (20) cooperates with a distance and speed control (44-51) and feedback (28) unit.

9 Claims, 7 Drawing Sheets.

APPARATUS FOR MANUAL WIRE BONDING

The present invention is directed to an apparatus for manual wire bonding as specified in the preamble of claim 1.

In microelectronics, bonding generally means the interconnection of components by cementing or welding as compared to normal soldering, in which the connections are made by means of solder (mostly a tin-lead alloy). One distinguishes between chip (die) bonding methods for mounting a component on a supporting substrate and wire bonding methods for connecting the component terminals to the substrate or, respectively, the contact pads of component and substrate by means of fine wires.

The present invention deals with the last-mentioned method, in which the so-called thermocompression bonding or ultrasonic wedge bonding is used. The bonding wires used are gold or aluminum wires of greater or smaller size. For certain cases, thermocompression bonding and ultrasonic bonding are combined. In that case one speaks of thermosonic bonding, as it is called, in which mostly gold wire is used which, similar to ball bonding, is melted off to form a ball, and welding or bonding takes place at a moderate heat (150° to 160° C.) by means of ultrasonic energy. This method can be well controlled and well automated. The use of aluminium wire is a further development of the thermosonic method. Melting-off takes place under forming gas so as to obtain an oxide-free surface. The use of the one or other bonding method depends substantially on the type and volume of the respective circuit design.

The above-mentioned bonding methods are mostly carried out by fully automatic bonding apparatus. But the hardware and software required therefor is highly complex and is not necessary in many cases.

It is therefore the object of the present invention to provide an apparatus for manual wire bonding which, while causing relatively little design effort, is easy to handle, operates accurately and can be adapted to a variety of external conditions.

In accordance with the invention the specified object is solved by the characterizing features of patent claim 1 and one or several of the further claims, respectively.

The significance of the invention resides in the variability and therefore the wide variety of possible applications while being extremely easy to handle, so that such an apparatus can also be successfully used in threshold countries. Moreover, the apparatus according to the invention is especially suited for performing bonding tests and pull tests. With the apparatus according to the invention it is also possible in an extremely simple way to determine the bonding conditions which must be observed for automated bonding. This applies especially to the movements to be performed by the bonding head in respect of distance and speed and the matching of empirical compression and/or ultrasonic and/or heating periods with the sequence of motions of the bonding head. At the same time, the control of the wire clamp can readily be matched with the movement of the bonding head. The function feedback provided in accordance with the invention is of particular significance. Every single function of the bonding head is checked for proper execution. When the counter-check indicates that the function has not been executed, the bonding operation is interrupted and must be restarted manually. Prior to restarting, the source of error can be checked and eliminated. Thereby it is also possible to considerably reduce the rate of rejects, which has so far been practically impossible with manual wire bonding.

For moving the bonding head and controlling the movements thereof a d.c. motor is especially suited, which is due to the characteristic of said motor. Basically, of course, other drive units such as stepping motors could also be used. But in all cases the counter-check of the movements performed by the bonding head and the movable units associated therewith, for instance wire clamp or vibration damping means, is important. Thus, the apparatus according to the invention is not only intended to be easily and individually adjustable but must also be adapted for checking as to each individual function.

Below, a preferred embodiment of an apparatus according to the invention shall be described in detail with reference to the accompanying drawing, wherein it is to be noted that modifications of the described embodiment shall be within the scope of the invention. In the drawing.

Figure 1:
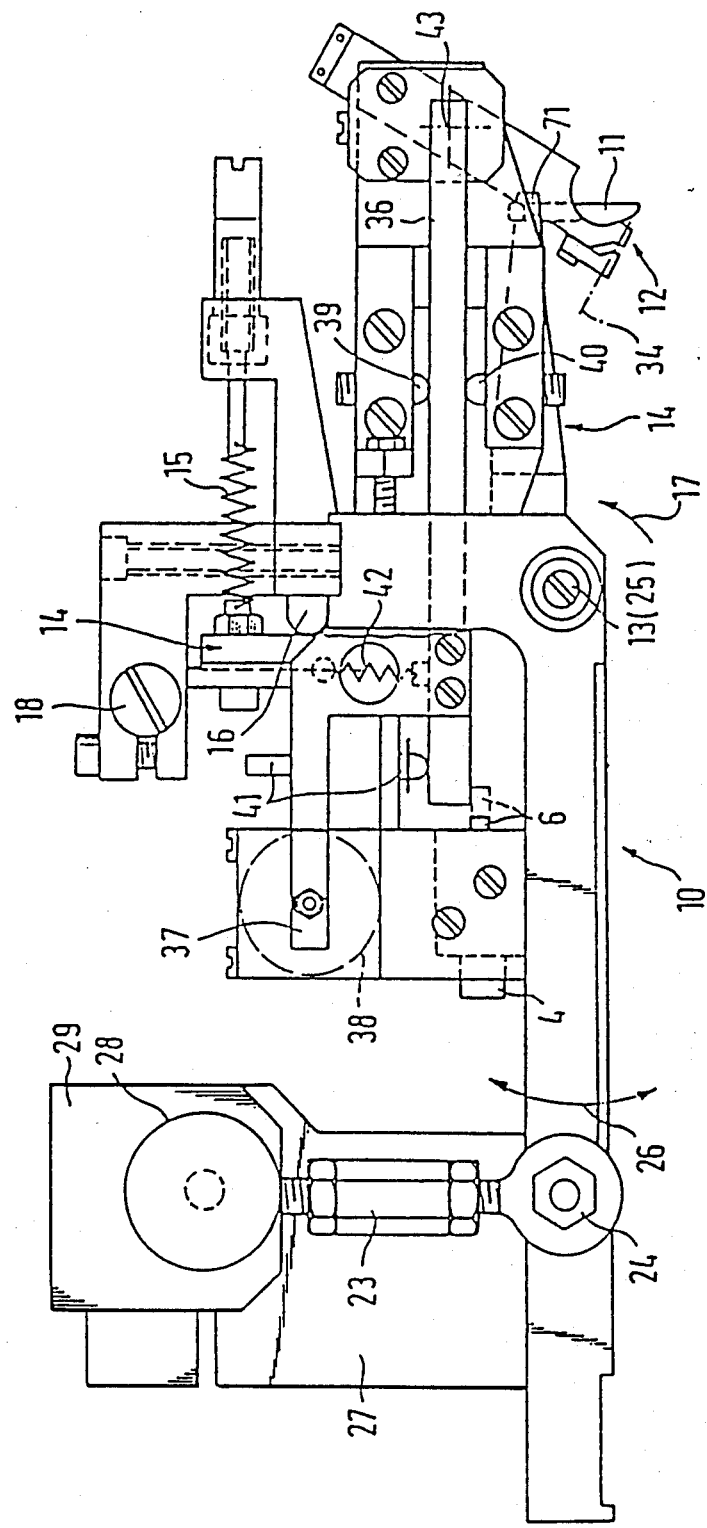
FIG. 1 is a side view of the bonding head of a bonding apparatus according to the invention.
Figure 2:
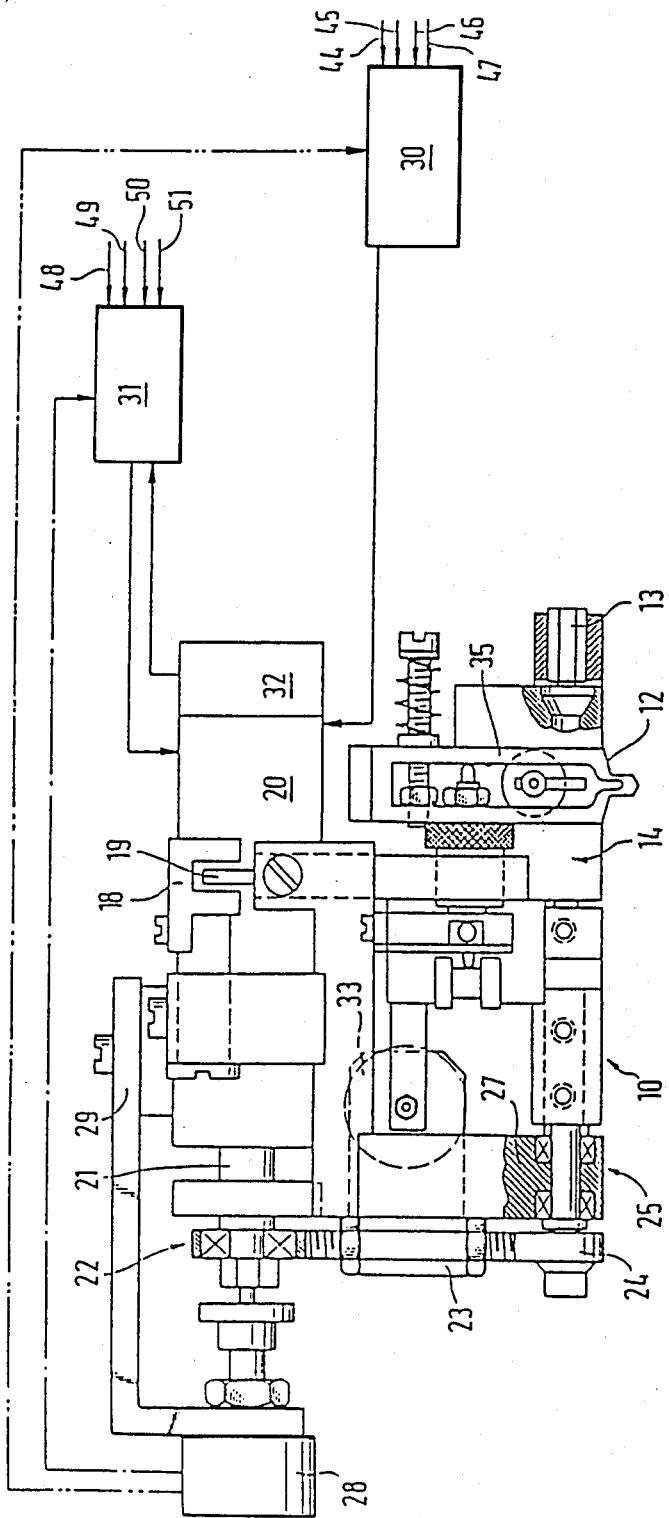
FIG. 2 is a front view of the bonding head of FIG. 1.

FIGS. 1 and 2 merely show a preferred bonding head design of an apparatus for manual wire bonding. This bonding head is mounted on an upright frame (not illustrated). Beneath the bonding head a base is provided for the components etc. to be bonded. The base also is not illustrated because it is a part which is known in principle. It should be noted, however, that the base is movable in a direction approximately transversely of the direction of movement 10 for positioning the bonding pads. The bonding head 10 comprises a wedge 11 operatively connected to an ultrasonic generator and having a wire clamp 12 associated therewith. The wire clamp 12 is mounted for reciprocating movement in longitudinal direction of the wire or wire advancing direction relative to the wedge 11. Moreover, it is biased in closing direction so that it must be opened against the biasing action in order to be movable relative to the wire without taking the wire along.

The wedge 11 is mounted on a support 14 which is mounted in the bonding head 10 for pivoting movement about an axis 13. The support 14 is retained by a tension spring 15 in engagement with a stop 16. Against the action of the tension spring 15 the support 14 and thus the wedge 11 are pivotable or upwardly displaceable in counterclockwise direction (arrow 17). Such displacement or pivoting movement occurs upon the so-called "touch-down" state of the wedge 11, i.e. when the wedge 11 touches the bonding pad that is to be bonded. The displacement of the support 14 and thus the touch-down state of the wedge 11 is detected by a sensor disposed in the bonding head 10, said sensor being in the form of a light barrier 18. More concretely, the illustrated embodiment employs a fork-type light barrier into which a projecting member 19 of the support 14 is extended (see FIG. 2). The light barrier 18 can be adjusted relative to the projecting member 19 such that the touch-down is indicated only when the support 14 has been pivoted about the axis 13 in the direction of the arrow 17 about a predetermined angle from the zero position or engagement with the stop 16, respectively. This angle defines the so-called overdrive. It is thereby ensured that the wedge 11 presses against the bonding pad with a predetermined force as determined by the tension spring 15. At the same time the light barrier 18 produces a signal for the up/down drive unit of the bonding head 10, which will be described later, so that the drive unit is turned off and the bonding head 10 stops. The bonding head 10 then occupies the so-call touch-down height, which is temporarily stored for determining the loop height.

The up/down movement of the bonding head 10 is caused by a d.c. servomotor 20 (see FIG. 2). The servomotor 20 is fixedly mounted in the upright frame (not illustrated) of the apparatus. The output shaft 21 of the motor 20 is coupled to an eccentric member 22. The latter is in turn coupled to an approximately vertically extending and length-variable plunger 23 whose other end, the bottom end in the present case, is linked to the bonding head 12 (link 24). In vertical direction the bonding head 10 may be guided by a linear bearing. In the illustrated embodiment the bonding head 10 is pivotable about a swivel bearing 25 disposed in the frame. The pivot of this bearing is aligned with the already mentioned pivot axis 13 for the support 14 of the wedge 11. The pivotal movement of the bonding head 10 about the bearing 25 is illustrated by a double-arrow 26 in FIG. 1. By the way, FIG. 2 shows a part of the frame, viz. the part comprising the swivel bearing 25. This part is referenced 27.

The output shaft 21 of the d.c. motor 20 is mechanically coupled through the eccentric member 22 to a feedback potentiometer 28 secured to a fixing bracket 29 which is fixed to the frame. This feedback potentiometer is coupled on one side to a distance comparing means and on the other side to a speed selecting means 31 the operation of which will be described farther below.

Moreover the servomotor has a tachogenerator 32 associated therewith for delivering actual-speed signals to the speed selecting means 31.

In order to suppress or dampen vibrations caused by the up/down movement of the bonding head 10 and acting on the wedge 11 prior to the bonding operation proper, the support 14 for the wedge 11 has a damping solenoid 33 allocated thereto which is selectively energized and then urges the support 14 against the stop 16. Upon touch-down of the bonding head or during the touch-down motion thereof the damping solenoid of course must be deenergized so that the support 14 can again be pivoted freely about the pivot axis 13.

Guiding of the wire towards the wedge 11 through the wire clamp 12 is indicated by the line 34 in FIG. 1. The wire clamp 12 is a U-clamp 35 biased towards the closed position (see FIG. 2). One leg of the U-clamp 35 is coupled to a lever 36 which is mounted in the bonding head 10 for pivoting motion about a vertical axis and the diametrically opposite end 37 of which is acted upon by a solenoid 38 such that, when the solenoid 38 is energized, the lever 36 is pivoted while opening the wire clamp 12. During this operation the lever 36 with its end coupled to the wire clamp 12 moves upwards out of the plane of the drawing in FIG. 1.

Finally, the lever 36 is also mounted in the bonding head 10 for pivoting movement about a horizontal axis extending approximately parallel to the pivot axis 13, the pivoting motion being limited in upward direction by a stop 39 and in downward direction by a stop 40. The pivoting motion of the lever 36 and thus of the wire clamp 12 in a vertical plane is caused by a solenoid or electromagnet 41 against the action of a tension spring 42, the tear-off spring as it is called. The upper stop 39 defines the so-called zero position of the wire clamp 12. With the lower stop 40 the wire tail length is adjusted. Each of the stops 39 and 40 is disposed in positionally variable fashion in the support 14 for the wedge 11. The lever 36 as well as the solenoid 38, the solenoid 41 and the stops 39, 40 and the tear-off spring 42 form part of the pivotally mounted support 14. The horizontal pivot axis of the lever 36 is defined by the pivot axis 43 of the wire clamp 12 at the forward or freely accessible end of the support 14. This pivot axis 43 extends approximately parallel to the pivot axis 13 of the support 14 within the bonding head 10.

The lever 36 has a further solenoid 44 associated therewith whose armature is connected to a projecting plunger 46. When the solenoid 44 is energized the plunger 46 is moved to such a position that the movement of the lever 36 about the pivot axis 43 in FIG. 1 is downwardly limited. The corresponding position of the plunger 46 is indicated in dashed lines in FIG. 1. The limitation of the pivoting movement of the lever 36 and thus of the wire clamp 12 becomes effective whenever the wire clamp 12 is intended to be moved to the wire tear-off position. To this end the wire clamp 12 in its open position is moved to the right in FIG. 1 relative to the wire 34 without taking the same along (the wire clamp 12 rotates counterclockwise about the axis 43). This relative movement of the wire clamp 12 is limited by the extended plunger 46 (shown in dashed lines in FIG. 1). When the wire 34, after having been fixed to the bonding pad, is to be torn off with the wedge 11 still in engagement, the solenoid 41 is merely deenergized and consequently the lever 36 is abruptly pulled upwards in FIG. 1 by the tear-off spring 42 while simultaneously the wire clamp 12 is pivoted in clockwise direction about the axis 43. Before that, however, the wire clamp 12 is moved to the closed position.

Below, the operation of the bonding apparatus according to the invention shall be described:

The distance comparing means 30, which is operatively connected to both the drive unit 20 and the feedback potentiometer 28, has four distance potentiometers 44, 45, 46 and 47 allocated thereto by which the following settings are provided:

potentiometer 44: fixing of the starting position or starting height of the bonding head 19 above the base carrying the bonding pad;

potentiometer 45: fixing of the first search position or search height (H1) of the bonding head 10;

potentiometer 46: fixing of the second search position or search height (H2) of the bonding head 10;

potentiometer 47: fixing of the loop height.

The speed selecting means 31 likewise has four potentiometers allocated thereto, viz. the speed potentiometers 48, 49, 50 and 51. By means of the potentiometer 48 the movement of the bonding head 10 to the starting position set by potentiometer 44 is initiated, where at the same time the rate of motion is fixed by the potentiometer 48.

The touch-down speed is fixed by the potentiometer 49. The potentiometer 50 is used to fix the up-and-down speed of the bonding head 10, the height is defined as the touch-down height.

Figure 3:
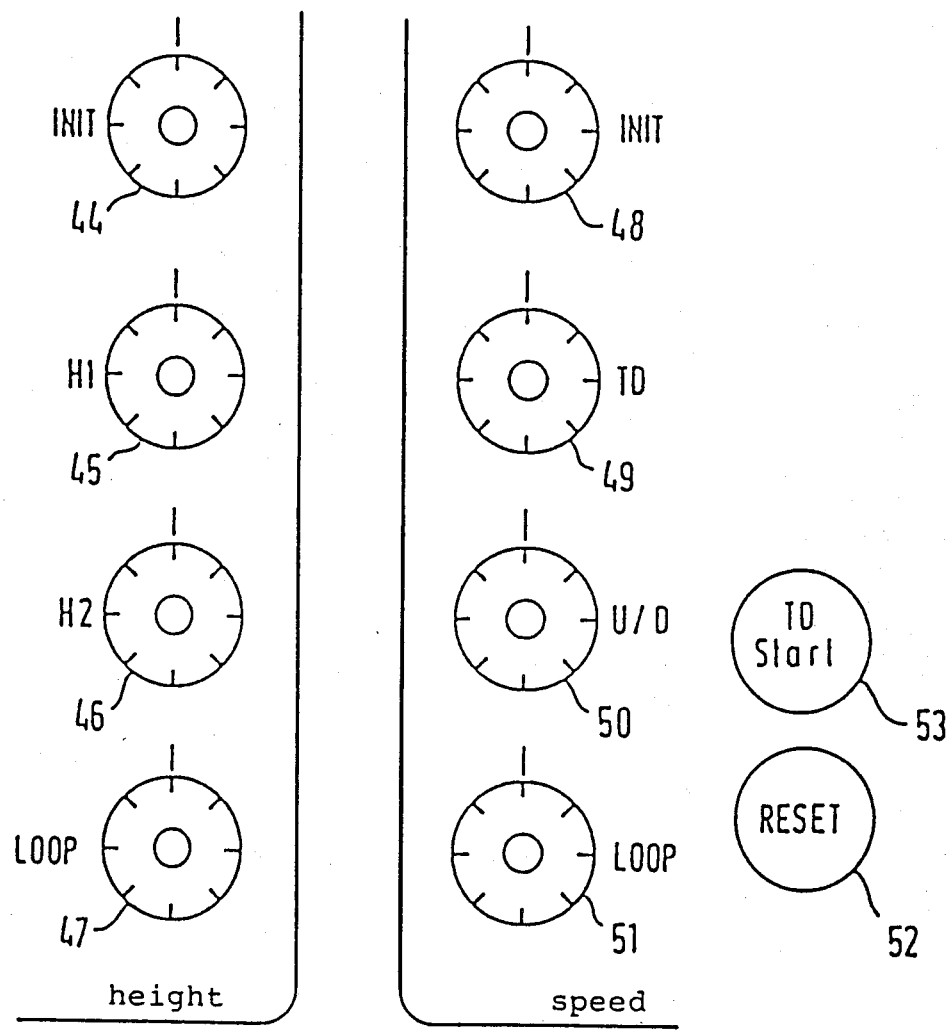
FIG. 3 is a schematic plan view showing the control panel of the apparatus according to the invention.

Finally, the so-called "loop" speed of the bonding head 10 is set by the potentiometer 51. The potentiometers are disposed on a control panel as shown in FIG. 3. This control panel also includes a reset switch 52 and a start button 53. When the start button 53 is depressed the bonding head 10 should be lowered from the starting position 54 to the first search height 55. The first search height of the bonding head 10 is set by the potentiometer 45. The actual lowering of the bonding head is detected by the feedback potentiometer 28. This actual-valve signal is compared in the distance comparing means 30 with the desired value set by the potentiometer 45. If the actual height does not correspond to the preset desired height, the bonding operation will be discontinued (stop 56 in Fig, 5a). The bonding operation can then be restarted by actuation of the reset switch 52, commencing from the starting position 54. But if the actual value coincides with the desired value, the bonding head will wait at the first search height for as long as the start button 53 is being depressed (waiting position 57 in FIG. 5a). During this time the first pad to be bonded (not illustrated) is manually positioned opposite the wedge 11 on the base, which is movable in x- and y-directions. After positioning of the first bonding pad the start button 53 is released so that the bonding head is lowered further at reduced speed, the so-called touch-down speed, until it touches the first bonding pad. This touch-down motion of the bonding head 10 is referenced 58 in FIG. 5a. At the beginning of the touchdown motion the damping solenoid 33, which was energized upon lowering of the bonding head 10 to the first search height 55, is deenergized so that upon touch-down of the wedge 11 on the first bonding pad the wedge 11 together with the support 14 may pivot about the axis 13 in FIG. 1 in anti-clockwise direction until the touch-down 59 is detected by the fork-type light barrier 18, so that then the motor 20 is turned off. In the touch-down position the wedge 11 is pressed against the bonding pad with a force which is determined by the tension spring 15. The touchdown position of the bonding head 10 is furthermore temporarily stored in a memory. Via the feedback potentiometer 28 a counter-check is made to determine whether the bonding head 10 after the touch-down signal from the forktype light barrier 18 has actually stopped. If this is not the case, a stop 61 of the bonding operation takes place so that the bonding operation must be repeated by depressing the reset switch 52. In that case the bonding head 10 would be moved to the starting position 54 again. But when the feedback potentiometer 28 indicates that the vertical motion of the bonding head 10 coincides with the touch-down signal the drive unit 20 is instructed by a programme unit 62 to remain in the touch-down position, for instance for a period of 40 ms. It is thereby achieved that during bonding the wedge 11 no longer performs any vibrations caused by the touch-down movement, i.e. that the wedge is absolutely still. The rest period of the bonding head upon touch-down is referenced 63 in FIG. 5a. When this rest period has elapsed, the transducer associated with the wedge 11 is instructed by the programme unit 62 to perform ultrasonic vibrations, which is done on a first channel. These ultrasonic vibrations are adjusted as to time and intensity (preferably by manual adjustment).

This process is discontinued by an "end" signal. If the programme unit does not detect such an "end" signal the bonding operation will be stopped (stop 64 in FIG. 5a). Upon indication of the ultrasonic energy-end signal the bonding head 10 is elevated to the so-called loop height 65 set by the loop potentiometer 47. The loop height 65 is a constant setting based on the temporarily stored (memory 60) touch-down height 59. The bonding head 10 is elevated at the loop speed. Through the feedback potentiometer 28 it would again be possible to check whether the bonding head 10 actually has moved through the set distance, based on the temporarily stored touch-down height. If not, the bonding operation could again be stopped and could be restarted via the reset switch 52.

Figure 5A:
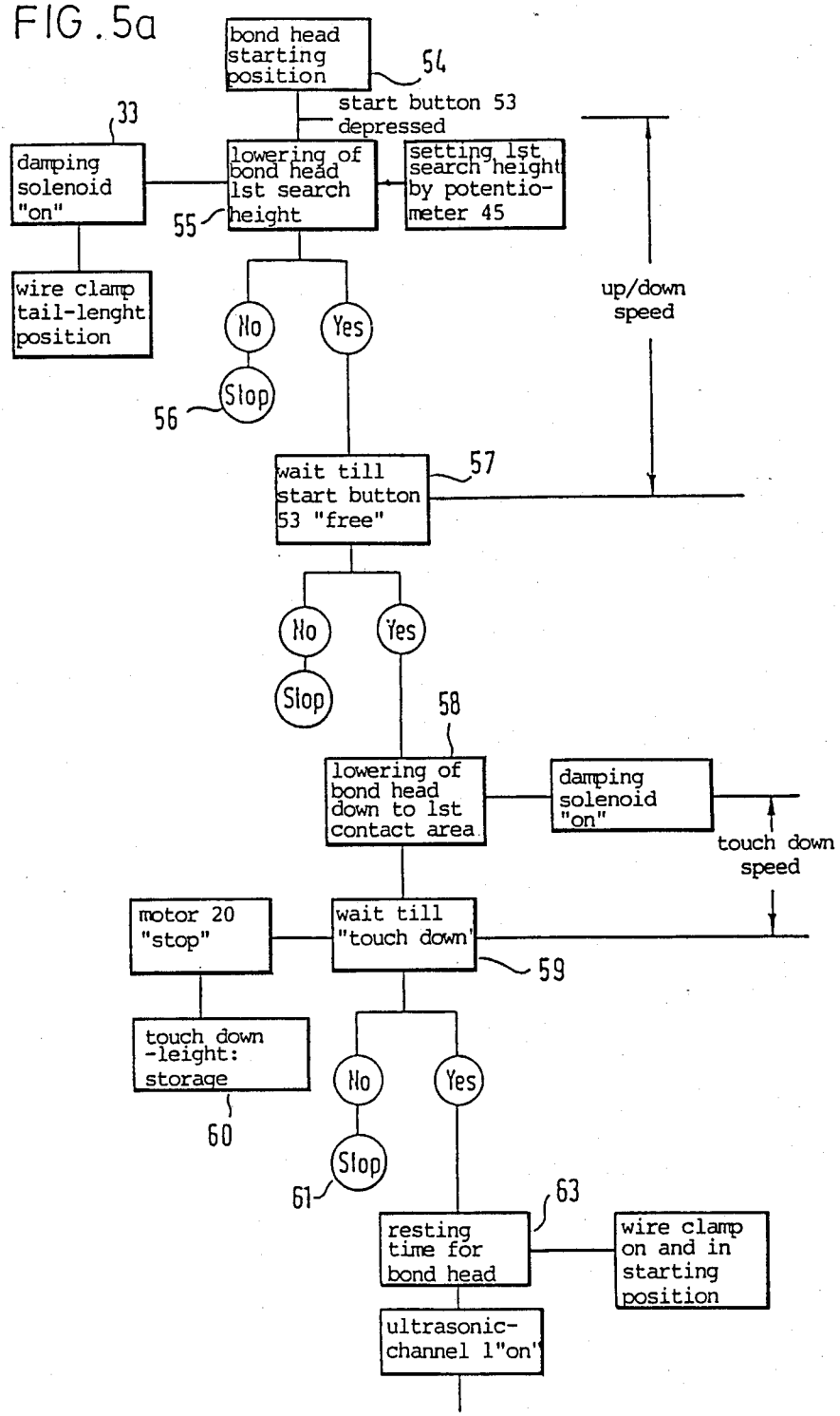
FIG. 5a–5c are flow charts of the apparatus according to the invention.
Figure 5B:
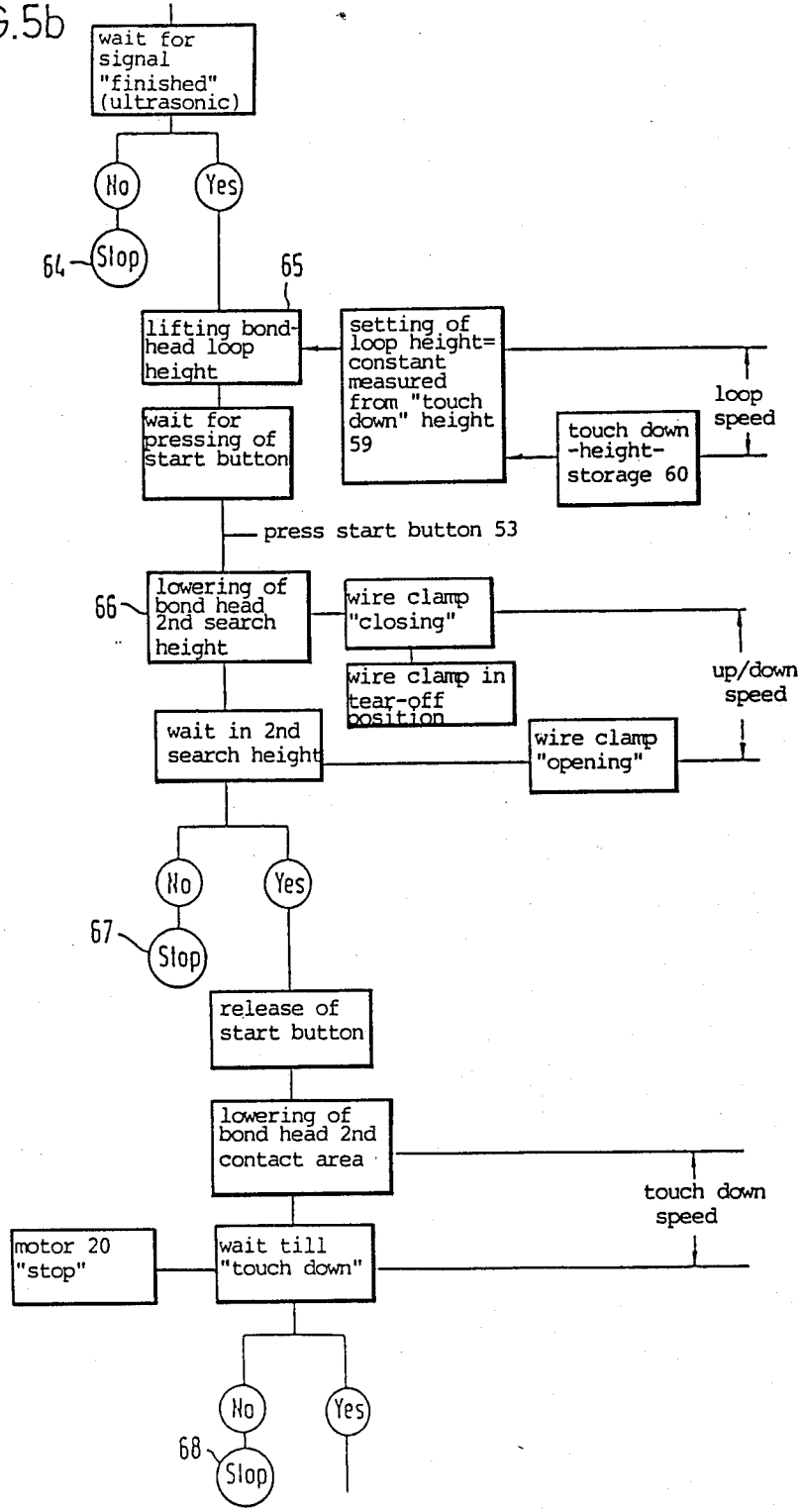
Figure 5C:
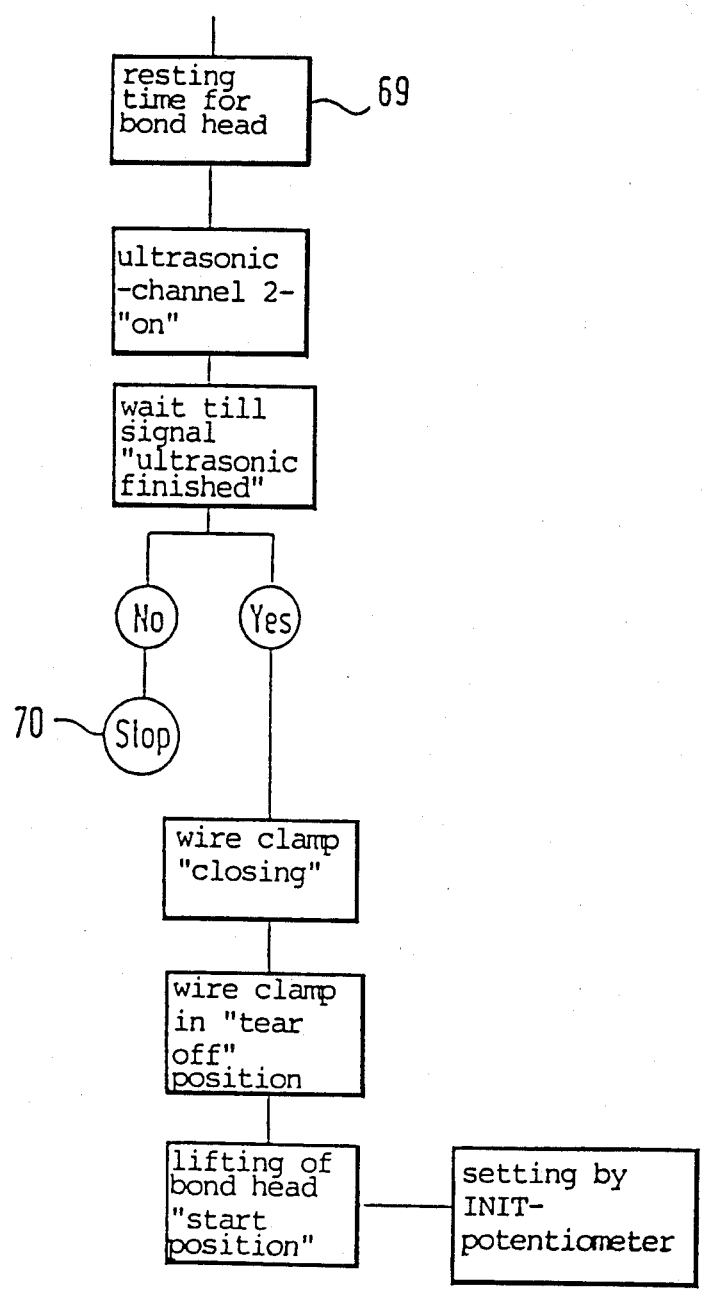

When the bonding head 10 is at the loop height 65, the start button 53 is again depressed in the flow chart illustrated as an example in FIGS. 5a to 5c, and consequently the bonding head 10 is lowered to the second search height 66 in which it finally remains. The lowering is performed at increased up-and-down speed as set by the potentiometer 50. By means of the feedback potentiometer 28 and the distance comparing means 30 a comparison between actual and desired values is made again. When the bonding head 10 has not reached the second search height set by the potentiometer 46 a stop signal 67 occurs and consequently the bonding operation would have to be restarted by depressing the reset switch 52. Upon coincidence of actual and desired values and when the second bonding pad is positioned opposite the wedge 11, the start button 53 may be released again so that the bonding head 10 is lowered onto the second bonding pad, which again occurs at the reduced touch-down speed until the fork-type light barrier 18 has detected the touch-down state on the second bonding pad. Upon receipt of this signal the motor 20 is stopped. If the actual movement of the bonding head 10 is not in conformity with the touch-down signal the bonding operation will be stopped (stop 68 in FIG. 5b with the consequences already described above). For the rest, the drive unit 20 is again supplied by the programme unit 62 with a rest signal 69 of e.g. 40 ms so that the wedge 11 touching the bonding pad is made absolutely still. When the bonding head 10 or the wedge 11 has been steadied the transducer is instructed on channel 2 to perform ultrasonic vibrations. This means that time and intensity may be selected to be different as compared to the ultrasonic vibrations on channel 1. The instruction to the transducer is delivered by the programme unit 62. The ultrasonic vibrations are made to stop by an ultrasonic energy-end signal. If this does not occur after a predetermined period of time, the bonding operation will be stopped (stop 70 in FIG. 5c). Following the ultrasonic energy-end signal the solenoid 38, which is responsible for opening the wire clamp 12, is instructed to close the wire clamp 12. Thereupon the solenoid 41 responsible for the movement of the wire clamp 12 in the direction of the bonding wire 34 is instructed to release the wire clamp 12 so that it is abruptly pulled by the tear-off spring 42 to the tear-off position while at the same time the wire 34 is torn off the bonded wire length. While this happens, the wedge 11 of course remains in contact with the second bonding pad and presses the bonded wire against the same. Subsequently, the bonding head 10 is again moved to the starting position set by the potentiometer 44, whereby a bonding cycle has been completed.

Figure 4:
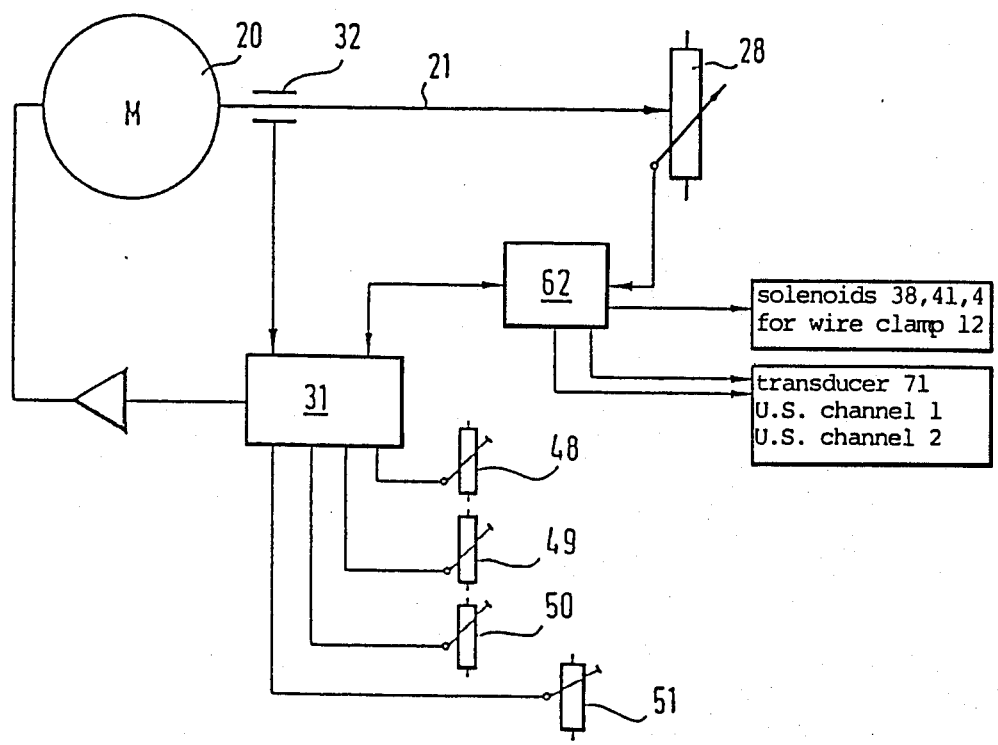
FIG. 4 illustrates schematically the speed control and feedback of the bonding head drive means.

FIG. 4 illustrates schematically in what way the tachogenerator associated with the drive unit 20 is coupled to the speed selecting means 31. By means of the potentiometers 48–51 the speeds of the bonding head for certain sub-motions are fixed. The tachogenerator 32 detects whether the preset speeds are observed; if not, a corresponding correction will be made. By means of the feedback potentiometer 28, which is likewise coupled to the speed selecting means 31, the change-over points for the differently selected speeds are determined, on the one hand, and on the other hand the approach of the bonding head to a preset final position is indicated so that a corresponding decelerrating signal can be delivered to the motor 20. The feedback potentiometer 28 therefore has multiple functions and is essential for the sequence of motions and functions of the apparatus according to the invention.

The programme unit 62 is additionally coupled to the distance potentiometers 44-47 so that, when predetermined bonding head heights have been reached and have been confirmed by the feedback potentiometer 28, corresponding instructions can be delivered to the transducer and/or a wedge heating means and to the actuating elements (solenoids 38, 41, 44) associated with the wire clamp 12.

It will be apparent from FIGS., 5a to 5c that, when the start button 53 is depressed and the bonding head 10 is lowered to the first search height 55, the wire clamp 12 is instructed to take the so-called "tail length" position. During the rest period 63 the wire clamp is opened and moved to the initial position. When the start button 53 is again depressed and the bonding head 10 is lowered from the loop height 65 to the second search height 66, the wire clamp 12 is again instructed to close and to move to the tear-off position. When the second search height has been reached the wire clamp 12 is re-opened. The further instructions to the wire clamp 12 subsequent to the second bonding operation have been described above with reference to FIG. 5c.

The transducer, which is allocated to the wedge 11 and has been mentioned several times, is referenced 71 in FIG. 1.

It should be noted again that the described flow of operations serves as an example only and that a greater or lesser number of feedback functions may be used depending on the requirements, in particular quality requirements, made on the bonding method. Above all it is possible that, when a deviation of the actual speeds from the desired speeds is detected by the tachogenerator 32 or when a predetermined threshold-level deviation occurs, the bonding operation is discontinued and must be restarted by actuation of the reset switch 52.

All of the features disclosed in the present documents shall be claimed as being essential to the invention to the extent to which they are novel over the prior art either individually or in combination.

I claim:

1. An apparatus for manual wire bonding, comprising an ultrasonically energizable and/or thermocompression wedge (11) for pressing the wire (34) against a bonding pad, wherein the wedge (11) is part of a bonding head (10) adapted to be moved towards and away from the bonding pad, especially in up/down direction, and the bonding pad is disposed on a base which is movable in a direction approximately transversely to the direction of movement of the bonding head for positioning the bonding pad opposite the wedge (11), and comprising control unit means for controlling a drive unit (20) for the bonding head (10), characterized in that the bonding head (10) is adapted to be moved by the drive unit, said drive unit including a d.c. servomotor (20), in accordance with the following cycle:

(a) lowering of the bonding head (10) from an elevated starting position (54) to a first search position (55);
(b) after positioning of a first bonding pad opposite the wedge (11), further lowering of the bonding head (10) onto the same while compressing the bonding wire (34) thereagainst;
(c) lifting of the bonding head (10) from the first bonding pad while moving the head to a predetermined loop position (65);
(d) lowering of the bonding head (10) to a second search position (66);
(e) after positioning of a second bonding pad opposite the wedge (11), further lowering of the bonding head (10) onto the same while compressing the bonding wire (34) thereagainst;
(f) lifting of the bonding head (10) to the starting position (54) after previously severing the bonded wire length, wherein said control unit means includes a distance control unit (44-47), a speed control unit (48-51), and a distance and speed feedback unit (28) so that each part-motion and non-motion of the bonding head (10) can be adjusted individually in respect of travelling distance and speed and motionless period, respectively, and can be checked for execution, said control unit means further includes:
(a) a manually actuated switch (start button 53) for initiating the bonding head motion,
(b) distance potentiometers (44, 45, 46, 47) for setting the starting position or height (54), the first search position or height (55), the second search position or height (66), and the loop position or height (65),
(c) speed potentiometers (48, 49, 50, 51) for setting the speed of the bonding head (10) from the starting position (54) to the first search position (55), from the first search position (55) to the first "touch-down" position, from the first "touch-down" position to the loop position (65), from the loop position (65) to the second search position (66), from the second search position (66) to the second "touch-down" position, and from the second "touch-down" position back to the starting position (54), wherein the speed potentiometers (48, 49, 50, 51) are coupled to the drive unit (20) via a speed selecting means (31), and wherein, the distance feedback unit comprises a feedback potentiometer, which is preferably mechanically coupled to the output (output shaft 21) of the drive unit (20), the output of said potentiometer being coupled to a distance comparing unit (30) in which the desired values set by the distance potentiometers (44, 45, 46, 47) are compared with the actualmotion values detected by the feedback potentiometer (28) to produce an error signal (NO) or a correct signal (YES), and wherein, the speed selecting means (31) associated with the speed potentiometers (48, 49, 50, 51) is coupled on the one hand to the feedback potentiometer and on the other hand to a tachogenerator (32) serving as a speed feedback unit (32), wherein the feedback potentiometer defines the speed change-over points and the tachogenerator (32) detects the actual speed of the bonding head motion so that upon a deviation from a preset desired speed a correction or interruption of the bonding operation will be possible.

2. An apparatus as claimed in claim 1, characterized in that a reset means (reset switch 52) is providing for returning the bonding head (10) to the starting position (54) in response to a distance, speed and/or non-motion error signal.

3. An apparatus as claimed in claim 1, characterized in that a memory (60) is provided for sorting the "touch-down" height of the first bonding pad from which the preset loop height (65) can be determined.

4. An apparatus as claimed in claim 1 characterized in that the wedge (11) is mounted in the bonding head (10) for movement, especially pivoting movement, approximately in the moving direction of said head, the wedge upon touch-down on the bonding pad being movable against the action of a resilient member (e.g. tension spring 15) from a zero position defined by a stop (16) to a "touch-down" position.

5. An apparatus as claimed in claim 4, characterized in that the movably mounted wedge (11) cooperates with a light barrier sensor (18) for detecting the relative motion of the wedge (11) upon "touch-down" and for producing a movement stop signal for the drive unit (20) of the bonding head (10).

6. An apparatus as claimed in claim 5, characterized in that a predetermined relative distance (overdrive) of the wedge (11) can be set by the sensor (light barrier 18).

7. An apparatus as claimed in claim 1, characterized in that the wedge (11) which is movably mounted in the bonding head (10) cooperates with a vibration damping means acting on the wedge (11) or the support (14) therefor, respectively, wherein the vibration damping means is active during movement of the bonding head (10) from the starting position (54) to the first search position (55) and, respectively, during movement of the bonding head (10) from the loop position (65) to the second search position (66).

8. An apparatus as claimed in claim 1, characterized in that a programme or command unit (60) coupled to the "feedback" potentiometer (28) is associated with a wire clamp (12) cooperating with the wedge (11) and with the actuating elements for opening and closing said clamp (solenoid 38) and for moving the clamp relative to the wedge (11) (solenoids 41, 44) in the direction of the bonding wire (34) extending through said wire clamp (12), the mentioned actuating elements (solenoids 38, 41, 44) being controlled by said programme or command unit (60).

9. An apparatus as claimed in claim 1, characterized in that the bonding head (10) is movable in up/down direction by means of a link mechanism or by means of a plunger (23) having one end coupled to the bonding head (10) and the other end coupled to an eccentric member (22) rotatably driven by the drive motor (20).

* * * * *

UNITED STATES PATENT AND TRADEMARK OFFICE
CERTIFICATE OF CORRECTION

PATENT NO. : 4,878,609

DATED : November 7, 1989

INVENTOR(S) : FARHAD FARASSAT

It is certified that error appears in the above-identified patent and that said Letters Patent is hereby corrected as shown below:

Col. 3, line 21,
      change "bonding head 12" to
      --bonding head 10--.

Col. 4, lines 38-39,
  line 39 should not begin a new paragraph - should read:
      --pulled upwards in Fig. 1 by the--.

Col. 4, line 62,
      change "where at" to --wherein at--.

Col. 5, lines 10-11,
      change "actual-valve signal" to
      --actual-value signal--.

Col. 8, line 57,
      change "actualmotion values" to
      --actual-motion values--.

Col. 9, line 10,
      change "sorting" to --storing--.

Signed and Sealed this

Twelfth Day of March, 1991

Attest:

HARRY F. MANBECK, JR.

*Attesting Officer*    *Commissioner of Patents and Trademarks*